United States Patent
Kim et al.

(10) Patent No.: US 8,587,006 B2
(45) Date of Patent: Nov. 19, 2013

(54) ORGANIC LIGHT-EMITTING DISPLAY

(75) Inventors: Mu-Gyeom Kim, Yongin (KR);
Byoung-Seong Jeong, Yongin (KR);
Chang-Mo Park, Yongin (KR);
Gun-Shik Kim, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 323 days.

(21) Appl. No.: 12/860,840

(22) Filed: Aug. 20, 2010

(65) Prior Publication Data
US 2011/0121299 A1    May 26, 2011

(30) Foreign Application Priority Data
Nov. 26, 2009   (KR) .................... 10-2009-0115189

(51) Int. Cl.
*H01L 29/227*    (2006.01)

(52) U.S. Cl.
USPC ............. 257/98; 257/40; 257/59; 257/72; 257/99; 257/E51.018; 257/E51.019

(58) Field of Classification Search
USPC .............. 257/40, 59, 72, 98, 99, E51.018, 257/E51.019, E33.055, E33.062, E33.065
See application file for complete search history.

(56) References Cited

U.S. PATENT DOCUMENTS

| | | | |
|---|---|---|---|
| 6,900,470 B2 * | 5/2005 | Kobayashi et al. ......... | 257/88 |
| 7,570,326 B2 * | 8/2009 | Matsuno .................... | 349/114 |
| 2005/0168135 A1 | 8/2005 | Iga | |
| 2008/0218064 A1 * | 9/2008 | Cho et al. .................. | 313/504 |
| 2012/0074439 A1 * | 3/2012 | Kho et al. .................. | 257/88 |

FOREIGN PATENT DOCUMENTS

| | | |
|---|---|---|
| JP | 2002-229482 (A) | 8/2002 |
| JP | 2005-181422 (A) | 7/2005 |
| JP | 2005-215649 (A) | 8/2005 |
| JP | 2009-198853 (A) | 9/2009 |
| KR | 10-2006-0085456 (A) | 7/2006 |
| KR | 10-2007-0075920 (A) | 7/2007 |

OTHER PUBLICATIONS

Korean Office Action dated Mar. 17, 2011 for Korean Patent Application No. KR 10-2009-0115189 which corresponds to the captioned application.
Korean Registration Determination Certificate dated Oct. 19, 2011 for Korean Patent Application No. KR 10-2009-0115189 which corresponds to captioned U.S. Appl. No. 12/860,840.
Japanese Office Action dated Nov. 6, 2012 for Japanese Patent Application No. JP 2010-143783 which shares priority of Korean Patent Application No. KR 10-2009-0115189 with captioned U.S. Appl. No. 12/860,840.
Japanese Office Action dated Jul. 16, 2013 for Japanese Patent Application No. JP 2010-143783 which shares priority of Korean Patent Application No. KR 10-2009-0115189 with captioned U.S. Appl. No. 12/860,840.

* cited by examiner

*Primary Examiner* — Matthew E Warren
(74) *Attorney, Agent, or Firm* — Knobbe, Martens, Olson & Bear LLP

(57) ABSTRACT

An organic light-emitting display apparatus including a thin-film transistor (TFT) is disclosed. In one embodiment, the organic light-emitting display apparatus includes a thin-film transistor (TFT) and an organic light-emitting device electrically connected to the TFT. The apparatus further includes a light blocking portion formed directly above at least a portion of the TFT and configured to prevent light, emitted from the organic light-emitting device, from entering the portion of the TFT.

20 Claims, 2 Drawing Sheets

ORGANIC LIGHT-EMITTING DISPLAY

CROSS-REFERENCE TO RELATED PATENT APPLICATION

This application claims the benefit of Korean Patent Application No. 10-2009-0115189, filed on Nov. 26, 2009, in the Korean Intellectual Property Office, the disclosure of which is incorporated herein in its entirety by reference.

BACKGROUND OF THE INVENTION

1. Field of the Invention

The present invention relates to an organic light-emitting display apparatus, and more particularly, to an organic light-emitting display apparatus comprising a thin-film transistor (TFT).

2. Description of the Related Technology

Active matrix type organic light-emitting display apparatuses include in each pixel a thin-film transistor (TFT) and an organic light emitting diode (OLED) electrically connected to the TFT.

SUMMARY OF CERTAIN INVENTIVE ASPECTS

One aspect of the present invention is an organic light-emitting display apparatus in which light emitted from an organic light-emitting device is prevented from being incident to an active layer of a thin-film transistor (TFT).

Another aspect is an organic light-emitting display apparatus comprising a thin-film transistor (TFT) and an organic light-emitting device that is formed on the TFT and is electrically connected to the TFT, wherein a light blocking portion that blocks light emitted from the organic light-emitting device is disposed on at least a portion of the TFT so that the light emitted from the organic light-emitting device is not directly incident to the TFT.

The light blocking portion may be disposed on a path of light emitted from the organic light-emitting device, through which the light is incident to the TFT.

Another aspect is an organic light-emitting display apparatus comprising: at least one thin-film transistor (TFT) that is formed on a substrate and comprises a gate electrode, an active layer insulated from the gate electrode, and source and drain electrodes respectively contacting the active layer; a plurality of first electrodes formed on the at least one TFT; a plurality of pixel defining layers (PDL) formed between the plurality of first electrodes; a plurality of organic layers formed on the plurality of first electrodes and the plurality of PDLs; and a second electrode formed on the plurality of organic layers and the plurality of PDLs, wherein a plurality of holes are formed in the plurality of PDLs at least at a side of the plurality of organic layers.

The second electrode may be formed in the holes of the PDLs. A portion of the light emitted from the organic layer may be reflected by the second electrode that is formed in the holes of the PDLs. The second electrode formed in the holes of the PDLs may prevent that light emitted from the organic layer is directly incident to the TFT.

The holes may be each formed to surround the active layer. The holes may each have a ring shape and are formed in the PDLs along a circumferential portion of the active layer. The holes may be formed such that a smallest distance between the holes and the source and drain electrodes is shorter than a wavelength of blue light. The active layer may comprise an oxide semiconductor.

Another aspect is an organic light-emitting display apparatus comprising: a thin-film transistor (TFT); an organic light-emitting device electrically connected to the TFT; and a light blocking portion formed directly above at least a portion of the TFT and configured to prevent light, emitted from the organic light-emitting device, from entering the portion of the TFT.

In the above apparatus, the light blocking portion is disposed on a path of light emitted from the organic light-emitting device, through which the light is incident to the TFT. In the above apparatus, the TFT comprises an active layer, and wherein the light blocking portion is formed substantially directly above the active layer of the TFT so that the emitted light is prevented from entering the active layer. In the above apparatus, the light blocking portion is non-linear.

Another aspect is n organic light-emitting display apparatus comprising: a thin-film transistor (TFT) formed on a substrate, wherein the TFT comprises i) a gate electrode, ii) an active layer insulated from the gate electrode, and iii) source and drain electrodes contacting the active layer; a first electrode formed over the TFT; a pixel defining layer (PDL) formed over the TFT and formed on at least a portion of the first electrode; a organic light-emitting layer formed on the first electrode and a first portion of the PDL; and a second electrode formed on the organic layer and a second portion of the PDL, wherein a plurality of openings are formed in the PDL at least at a side of the organic light-emitting layer.

In the above apparatus, the second electrode is formed in the openings of the PDL. In the above apparatus, the second electrode formed in the openings of the PDL is configured to reflect a portion of the light emitted from the organic layer. In the above apparatus, the second electrode formed in the openings of the PDL is configured to prevent light, emitted from the organic layer, from entering the TFT. In the above apparatus, the openings are formed substantially directly above the active layer. In the above apparatus, the openings have a ring shape and are formed in the PDL along a circumferential portion of the active layer.

In the above apparatus, the openings are formed such that the shortest distance between the openings and the source and drain electrodes is less than a wavelength of blue light. In the above apparatus, the active layer is formed of an oxide semiconductor. In the above apparatus, the area of the second portion of the PDL is greater than the area of the first portion of the PDL. In the above apparatus, the distance between the substrate and the organic light-emitting layer is substantially similar to the distance between the substrate and the openings.

Another aspect is an organic light-emitting display apparatus comprising: a thin-film transistor (TFT); and an organic light-emitting diode (OLED) device electrically connected to the TFT, wherein the OLED device comprises i) a first electrode contacting the TFT, ii) an organic light-emitting layer formed on the first electrode and iii) a second electrode formed on the organic light-emitting layer, wherein the second electrode has at least one non-linear portion which is located substantially directly above the TFT.

In the above apparatus, the TFT comprises: a gate electrode formed over a substrate; a gate insulating layer formed on the substrate and gate electrode; an active layer formed on the gate insulating layer, wherein the active layer is formed substantially directly above the gate electrode, and wherein the at least one non-linear portion is located substantially directly above the active layer; and source and drain electrodes contacting the active layer.

In the above apparatus, further comprising: a passivation layer covering the TFT; and a pixel defining layer formed on the passivation layer, wherein at least one opening is defined in the pixel defining layer, and wherein the at least one non-linear portion is formed in the opening. In the above apparatus, the opening and non-linear portion are formed substantially directly above the active layer. In the above apparatus, the opening is formed such that the shortest distance between the opening and the source and drain electrodes is shorter than a wavelength of blue light. In the above apparatus, the non-linear portion contacts the passivation layer.

DETAILED DESCRIPTION OF CERTAIN INVENTIVE EMBODIMENTS

An active layer of the TFT is usually formed of amorphous silicon or polysilicon. Recently, attempts have been made to form an active layer using an oxide semiconductor. However, the characteristics of the oxide semiconductor, such as a threshold voltage, an S-factor, or the like, are likely to vary due to the penetration of water, oxygen or light from the outside. Also, the variation in the threshold voltage due to the water, oxygen or light is further increased by a DC bias of a gate electrode during driving of the TFT. Thus, the DC stability is the greatest problem in regard to use of the oxide semiconductor. In order to improve the barrier characteristics of the oxide semiconductor against water or oxygen, an $AlO_x$ layer or a TiN layer is used. However, since these layers are formed by using a reactive sputtering method or an atomic layer deposition (ALD) method, it is difficult to apply them to a large-sized substrate, and a mass production rate of the layers is low.

Embodiments of the present invention will now be described more fully with reference to the accompanying drawings, in which exemplary embodiments of the invention are shown.

Figure 1:
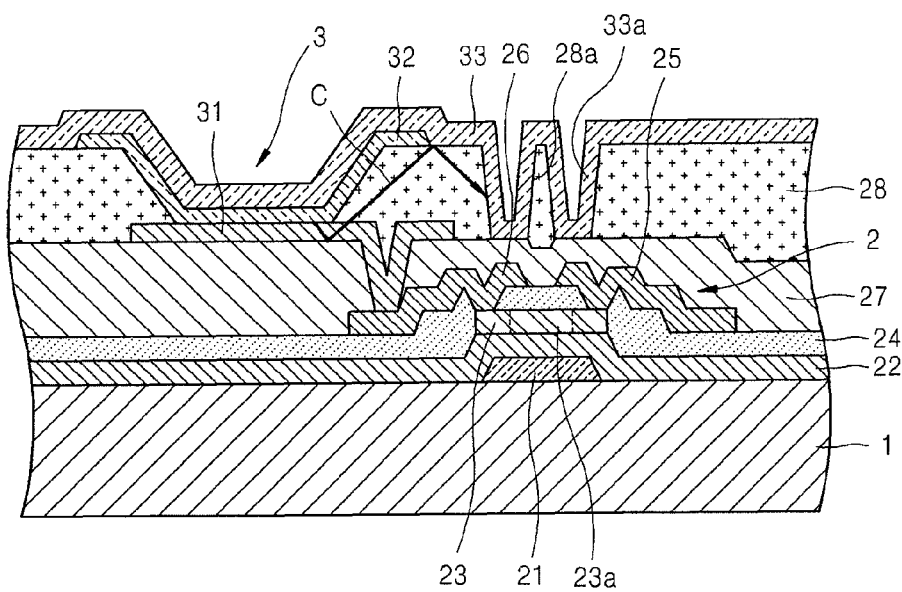
FIG. 1 is a cross-sectional view illustrating an organic light-emitting display apparatus according to an embodiment of the present invention.

FIG. 1 is a cross-sectional view illustrating an organic light-emitting display apparatus according to an embodiment of the present invention. Referring to FIG. 1, a thin-film transistor (TFT) 2 and an organic light-emitting device 3 are disposed on a substrate 1. In FIG. 1, for convenience of explanation, a portion of one pixel of the organic light-emitting display apparatus is illustrated. However, the organic light-emitting display apparatus may include a plurality of pixels.

The TFT 2 includes i) a gate electrode 21 formed on the substrate 1, ii) a gate insulating layer 22 covering the gate electrode 21, iii) an active layer 23 formed on the gate insulating layer 22, iv) an insulating layer 24 formed on the gate insulating layer 22 to cover the active layer 23, and v) a source electrode 25 and a drain electrode 26 that are formed on the insulating layer 24 and contact the active layer 23.

Although the TFT 2 of FIG. 1 is a bottom gate type TFT, a top gate type TFT may also be used. A buffer layer (not shown) formed of an organic material such as a silicon oxide may be further formed on the substrate 1.

The gate electrode 21 may be formed of a single layer or multi-layer using a conductive metal. The gate electrode 21 may include molybdenum. The gate insulating layer 22 may be formed of a silicon oxide, a tantalum oxide, or an aluminum oxide, but is not limited thereto.

In one embodiment, the active layer 23, which is patterned, is formed on the gate insulating layer 22 and substantially directly above the gate electrode 21. The active layer 23 may be formed of an oxide semiconductor. For example, the active layer 23 may be an $a(In_2O_3)b(Ga_2O_3)c(ZnO)$ layer (G-I-Z-O layer), where a, b, and c are actual numbers that satisfy a≥0, b≥0, and c>0, respectively.

In one embodiment, the insulating layer 24 is formed to cover a substantial portion of the active layer 23. The insulating layer 24 protects a channel 23a of the active layer 23. In one embodiment, as illustrated in FIG. 1, the insulating layer 24 covers the active layer 23 except for portions of the active layer 23 contacting the source and drain electrodes 25 and 26, but is not limited thereto. Although not shown in FIG. 1, the insulating layer 24 may be formed only on the channel 23a.

The source electrode 25 and the drain electrode 26 are formed on the insulating layer 24 to contact the active layer 23. A passivation layer 27 is formed on the insulating layer 24 to cover the source electrode 25 and the drain electrode 26. A first electrode 31 of the organic light-emitting device 3 contacting the drain electrode 26 is formed on the passivation layer 27.

A pixel defining layer (PDL) 28 that exposes a portion of the first electrode 31 is formed on the passivation layer 27, and an organic layer 32 and a second electrode 33 are formed on the first electrode 31 that is exposed via the PDL 28.

In one embodiment, the PDL 28 is formed to cover ends of the first electrode 31. In addition to defining a light emitting area, the PDL 28 widens a distance between the first electrode 31 and the second electrode 33 in a direction toward the edges of the first electrode 31 and the second electrode 33, thereby preventing concentration of an electric field on the ends of the first electrode 31. Thus a short circuit between the first electrode 31 and the second electrode 33 is prevented. In one embodiment, the PDL 28 prevents light, emitted from the organic layer 33, from entering the TFT 2, which will be described in detail later.

In one embodiment, the first electrode 31 is formed in each pixel by patterning. In a front emission type organic light-emitting display apparatus, in which an image is formed toward the second electrode 33, the first electrode 31 may be a reflective electrode. To this end, a reflective layer formed of, for example, an alloy of Al, Ag, or the like may be formed as the first electrode 31.

When the first electrode 31 is used as an anode electrode, the first electrode 31 includes a layer formed of, for example, a metal oxide, such as ITO, IZO, or ZnO, which has a high work function (absolute value). When the first electrode 31 is used as a cathode electrode, the first electrode 31 may include a highly conductive metal having a low work function (absolute value), such as Ag, Mg, Al, Pt, Pd, Au, Ni, Nd, Ir, Cr, Li, or Ca. Thus, in this case, the above-described reflective layer may not be necessary.

The second electrode 33 may be a light-transmissive electrode. To this end, the second electrode 33 may include a semi-transmissive reflective layer comprising a thin film formed of, for example, Ag, Mg, Al, Pt, Pd, Au, Ni, Nd, Ir, Cr, Li, or Ca, or a light-transmissive metal oxide such as ITO, IZO, or ZnO. When the first electrode 31 is used as an anode, the second electrode 33 is used as a cathode. Further, when the first electrode 31 is used as a cathode, the second electrode 33 is used as an anode.

The organic layer 32 interposed between the first electrode 31 and the second electrode 33 may be formed of a stack structure in which a hole injection layer, an emission layer, an electron injection and transporting layer, etc., are stacked or some of these layers are selectively stacked. However, the emission layer is generally included in the stack structure.

Meanwhile, although not shown in FIG. 1, a protection layer may be further formed on the second electrode 33, and the pixel may be encapsulated using, for example, glass.

In one embodiment, a light blocking portion 33a is formed so that light emitted from the organic layer 32 is not directly incident to the TFT 2 or at least the active layer 23 of the TFT 2.

When the active layer 23 is formed of an oxide semiconductor as described above, light, oxygen, water, etc., is desirable to be blocked. Among these, oxygen and water may be blocked to some extent by using the first electrode 31 and the second electrode 33 or using an encapsulation process included in the manufacturing process of the organic light-emitting display apparatus. Alternatively, among the light incident to the TFT 2, external light may be blocked by using UV coating, a black matrix, etc. However, light emitted from the organic layer 32 of the organic light-emitting device 3, for example, blue light having a wavelength of about 450 nm, may adversely affect the TFT 2.

Figure 3:
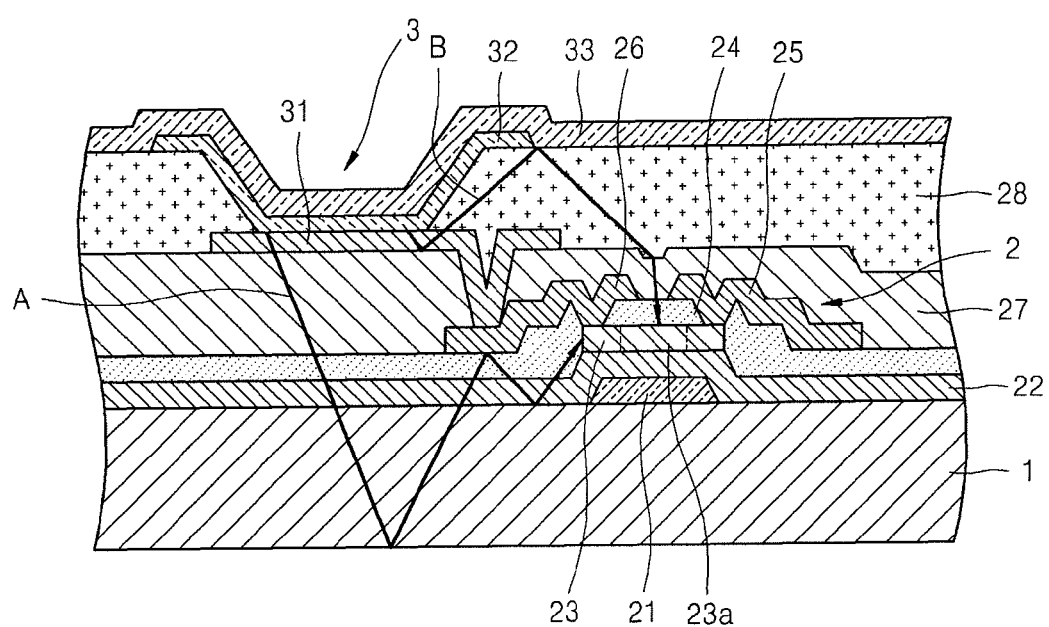
FIG. 3 is a cross-sectional view illustrating a general organic light-emitting display apparatus.

That is, as can be seen in a general organic light-emitting display apparatus illustrated in FIG. 3, there are two paths through which light emitted from the organic layer 32 may be incident to the TFT 2. The first path is a path that is denoted with a letter A in FIG. 3 and through which light emitted from the organic layer 32 is irradiated to the active layer 23 through between the source and drain electrodes 25 and 26 and the gate electrode 21. However, in this case, since the distance between i) the source and drain electrodes 25 and 26 and ii) the gate electrode 21 is usually about 350 nm, which is smaller than the 450 nm wavelength of blue light, there is a low possibility that light is irradiated to the TFT 2. The second path is a path denoted with a letter B in FIG. 3 and through which light emitted from the organic layer 32 is irradiated to the active layer 23 through the PDL 28 and the passivation layer 27. In this case, since the distance between i) the source and drain electrodes 25 and 26 and ii) the second electrode 33 is at least about 1800 nm, the light emitted from the organic layer 32 is highly likely to be guided to the active layer 23.

In one embodiment, a hole (or an opening) 28a is formed in the PDL 28 around the active layer 23. Further, the second electrode 33 is formed in the hole 28a as the light blocking portion 33a so that the light emitted from the organic layer 32 is not directly incident to the TFT 2. The hole 28a may be formed substantially directly above the active layer 23 or above the source and drain regions which the source and drain electrodes 25 and 26 contact respectively. In one embodiment, the organic light-emitting display apparatus is manufactured as follows.

First, the gate electrode 21 is formed on the substrate 1. Then the gate insulating layer 22, the active layer 23, and the insulating layer 24 are sequentially stacked on the gate electrode 21. A contact hole is formed in the insulating layer 24, and then source and drain electrodes 25 and 26 are formed thereon. Next, the passivation layer 27 is formed to cover the source and drain electrodes 25 and 26. The first electrode 31 is formed on the passivation layer 27, and the PDL 28 is formed to cover two ends of the first electrode 31, and then the organic layer 32 and the second electrode 33 are formed on the first electrode 31.

In one embodiment, the hole 28a is formed in the PDL 28 in a portion of the PDL 28 that corresponds to a path through which light emitted from the organic layer 32 is incident to the TFT 2. In one embodiment, the hole 28a is formed in the PDL 28 along a circumferential portion of the active layer 23, thereby surrounding the active layer 23. The hole 28a may have a ring shape to surround the active layer 23. After the hole 28a is formed in the PDL 28, the organic layer 32, and the second electrode 33 are sequentially formed on the PDL 28. Since the second electrode 33 is formed on the whole PDL 28 to cover the PDL 28, the second electrode 33 is also formed in the hole 28a formed in the PDL 28, and thus a portion of the second electrode 33 follows the shape of the hole 28a. This portion of the second electrode 33 that follows the shape of the hole 28a functions as the light blocking portion 33a.

The hole 28a and the light blocking portion 33a in the hole 28a are formed on a path of light that is incident from the organic layer 32 to the TFT 2. In other words, the hole 28a and the light blocking portion 33a in the hole 28a are formed over at least a portion of the TFT 2. In one embodiment, the hole 28a and the light blocking portion 33a in the hole 28a are formed substantially directly above at least a portion of the TFT 2, for example, the active layer 23.

As described above, as the hole 28a is formed in the PDL 28 in a portion around the active layer 23, and the light blocking portion 33a is formed by forming the second electrode 33 in the hole 28a of the PDL 28, light emitted from the organic layer 32 may be prevented from being irradiated to the active layer 23. That is, as denoted with a letter C in FIG. 1, the light emitted from the organic layer 32 is blocked by the light blocking portion 33a and thus cannot transmit through the active layer 23.

In FIG. 1, the portion of the PDL 28 corresponding to the hole 28a is completely removed; however the present invention is not limited thereto, and only a portion of the PDL 28 may be removed to form the hole 28a. However, regardless of whether a portion of the PDL 28 corresponding to the hole 28a is completely removed or not, the distance between a lower end portion of the light blocking portion 33a and the source and drain electrodes 25 and 26 may be smaller than the 450 nm wavelength of blue light.

Figure 2:
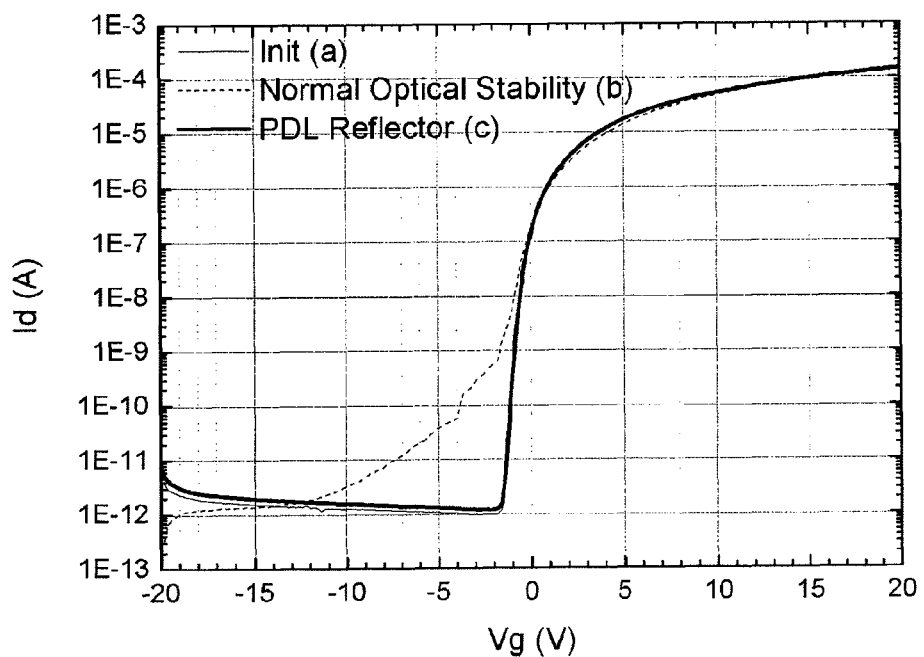
FIG. 2 is a graph showing negative bias thermal stability (NBTS) of an oxide semiconductor when a light blocking portion is included in the organic light-emitting display apparatus of FIG. 1 and NBTS of an oxide semiconductor when no light blocking portion is included in the organic light-emitting display apparatus of FIG. 1.

FIG. 2 is a graph showing negative bias thermal stability (NBTS) of an oxide semiconductor when a light blocking portion is included in the organic light-emitting display apparatus of FIG. 1 and NBTS of an oxide semiconductor when no light blocking portion is included in the organic light-emitting display apparatus of FIG. 1. Referring to FIG. 2, (a) denotes an NBTS graph of an oxide semiconductor in an initial stage in which light is not irradiated, and (b) denotes an NBTS graph of an oxide semiconductor when a light blocking portion is not included and light emitted from an organic layer is irradiated to an active layer, and (c) denotes an NBTS graph of an oxide semiconductor when a light blocking portion is included and light is irradiated to an active layer. As illustrated in FIG. 2, in the case when a light blocking portion is included (c), the NBTS is similar to that of the oxide semiconductor (a) in the initial stage in which light is not irradiated. Thus, it can be seen that when a light blocking portion is included, most of light emitted from the organic layer and irradiated to the active layer is blocked.

According to at least one embodiment of the present invention, light emitted from the organic light-emitting device 3 is prevented from being directly incident to the TFT 2, thereby increasing the reliability of an oxide, reducing products defects, and increasing user convenience.

According to at least one embodiment of the present invention, light emitted from the organic light-emitting device is prevented from entering the active layer of the TFT, thereby increasing the stability of the active layer.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display apparatus comprising:
   a thin-film transistor (TFT);
   an organic light-emitting layer electrically connected to the TFT;
   a light blocking portion formed directly above at least a portion of the TFT and configured to prevent light, emitted from the organic light-emitting layer, from entering the portion of the TFT; and
   a pixel defining layer (PDL) formed over the TFT, wherein at least one opening is formed in the PDL at least at a side of the organic light-emitting layer, and wherein part of the light blocking portion passes through the opening,
   wherein the TFT comprises an active layer, and wherein the opening is formed substantially directly above the active layer.

2. The organic light-emitting display apparatus of claim 1, wherein the light blocking portion is disposed on a path of light emitted from the organic light-emitting layer, through which the light is incident to the TFT.

3. The organic light-emitting display apparatus of claim 1, further comprising a passivation layer covering the TFT and formed below the PDL, wherein the light blocking portion contacts the passivation layer.

4. The organic light-emitting display apparatus of claim 1, wherein the light blocking portion is non-linear.

5. An organic light-emitting display apparatus comprising:
   a thin-film transistor (TFT) formed on a substrate, wherein the TFT comprises i) a gate electrode, ii) an active layer insulated from the gate electrode, and iii) source and drain electrodes contacting the active layer;
   a first electrode formed over the TFT;
   a pixel defining layer (PDL) formed over the TFT and formed on at least a portion of the first electrode;
   an organic light-emitting layer formed on the first electrode and a first portion of the PDL; and
   a second electrode formed on the organic light-emitting layer and a second portion of the PDL,
   wherein at least one opening is formed in the PDL at least at a side of the organic light-emitting layer, wherein part of the second electrode passes through the opening,
   wherein the TFT comprises an active layer, and wherein the opening is formed substantially directly above the active layer.

6. The organic light-emitting display apparatus of claim 5, further comprising a passivation layer covering the TFT and formed below the PDL, wherein the part of the second electrode contacts the passivation layer.

7. The organic light-emitting display apparatus of claim 5, wherein the part of the second electrode is configured to reflect a portion of the light emitted from the organic light-emitting layer.

8. The organic light-emitting display apparatus of claim 5, wherein the part of the second electrode is configured to prevent light, emitted from the organic light-emitting layer, from entering the TFT.

9. The organic light-emitting display apparatus of claim 5, wherein the part of the second electrode is substantially aligned with the active layer.

10. The organic light-emitting display apparatus of claim 5, wherein the opening has a ring shape.

11. The organic light-emitting display apparatus of claim 5, wherein the opening is formed such that the shortest distance between the opening and the source and drain electrodes is less than a wavelength of blue light.

12. The organic light-emitting display apparatus of claim 5, wherein the active layer is formed of an oxide semiconductor.

13. The organic light-emitting display apparatus of claim 5, wherein the area of the second portion of the PDL is greater than the area of the first portion of the PDL.

14. The organic light-emitting display apparatus of claim 5, wherein the distance between the substrate and the organic light-emitting layer is substantially similar to the distance between the substrate and the opening.

15. An organic light-emitting display apparatus comprising:
   a thin-film transistor (TFT);
   an organic light-emitting diode (OLED) device electrically connected to the TFT, wherein the OLED device comprises i) a first electrode contacting the TFT, ii) an organic light-emitting layer formed on the first electrode and iii) a second electrode formed on the organic light-emitting layer, wherein the second electrode has at least one non-linear portion which is located substantially directly above the TFT; and
   a pixel defining layer (PDL) formed over the TFT, wherein at least one opening is formed in the PDL at least at a side of the organic light-emitting layer, and wherein part of the non-linear portion passes through the opening,
   wherein the TFT comprises an active layer, and wherein the opening is formed substantially directly above the active layer.

16. The organic light-emitting display apparatus of claim 15, wherein the TFT comprises:
   a gate electrode formed over a substrate;
   a gate insulating layer formed on the substrate and gate electrode; and
   source and drain electrodes contacting the active layer,
   wherein the active layer is formed on the gate insulating layer, and wherein the active layer is formed substantially directly above the gate electrode.

17. The organic light-emitting display apparatus of claim 15, wherein the non-linear portion is formed substantially directly above the active layer.

18. The organic light-emitting display apparatus of claim 15, wherein the opening is formed such that the shortest distance between the opening and the source and drain electrodes is shorter than a wavelength of blue light.

19. The organic light-emitting display apparatus of claim 15 wherein the non-linear portion is substantially aligned with the active layer.

20. An organic light-emitting display apparatus comprising:
   a thin-film transistor (TFT);
   an organic light-emitting diode (OLED) device electrically connected to the TFT, wherein the OLED device comprises i) a first electrode contacting the TFT, ii) an organic light-emitting layer formed on the first electrode and iii) a second electrode formed on the organic light-emitting layer, wherein the second electrode has at least one non-linear portion which is located substantially directly above the TFT;

a passivation layer covering the TFT, wherein the part of the non-linear portion contacts the passivation layer; and a pixel defining layer (PDL) formed over the TFT, wherein at least one opening is formed in the PDL, and wherein part of the non-linear portion passes through the opening, wherein the TFT comprises an active layer, and wherein the opening is formed substantially directly above the active layer.

* * * * *